US012588137B1

(12) United States Patent
Besseler et al.

(10) Patent No.:  US 12,588,137 B1
(45) Date of Patent:     Mar. 24, 2026

(54) INTERPOSER BOARD SIDE WALL HAVING ELECTRICAL FEATURES

(71) Applicants: Edmilson Besseler, San Jose, CA (US); Shu-Fong Tsau, Palatine, IL (US)

(72) Inventors: Edmilson Besseler, San Jose, CA (US); Shu-Fong Tsau, Palatine, IL (US)

(73) Assignee: Snap Inc., Santa Monica, CA (US)

( * ) Notice: Subject to any disclaimer, the term of this patent is extended or adjusted under 35 U.S.C. 154(b) by 425 days.

(21) Appl. No.: 18/129,176

(22) Filed: Mar. 31, 2023

(51) Int. Cl.
| | |
|---|---|
| *G01R 31/28* | (2006.01) |
| *H05K 1/02* | (2006.01) |
| *H05K 1/11* | (2006.01) |
| *H05K 1/14* | (2006.01) |

(52) U.S. Cl.
CPC ....... H05K 1/0268 (2013.01); G01R 31/2818 (2013.01); H05K 1/116 (2013.01); H05K 1/144 (2013.01); *H05K 2201/042* (2013.01); *H05K 2201/10098* (2013.01); *H05K 2201/10378* (2013.01)

(58) Field of Classification Search
CPC .. G01R 1/04; G01R 1/07328; G01R 31/2805; G01R 31/68; H05K 2201/09009
See application file for complete search history.

(56) References Cited

U.S. PATENT DOCUMENTS

| | | | | |
|---|---|---|---|---|
| 2016/0172293 A1* | 6/2016 | Shelsky | ............. | G01R 31/2818 |
| | | | | 174/260 |
| 2017/0179067 A1* | 6/2017 | Aoki | ....................... | H01L 24/75 |
| 2021/0011069 A1* | 1/2021 | Chen | .................. | G01R 31/2896 |

* cited by examiner

*Primary Examiner* — Tung X Nguyen
(74) *Attorney, Agent, or Firm* — CM Law; Stephen J. Weed

(57) ABSTRACT

A stacked printed circuit board assembly (PCBA) including an interposer board extending between a two circuit boards. The interposer board has a side wall including pads that are electrically tied to vias extending between electronic components of the circuit boards to allow testing of the electronic components and connections to any other electronic system. The test pads increase the number of probing points of the PCBA. Electrical traces electrically interconnect the test pads to the electronic components and may include electrical traces extending laterally through the interposer boards.

20 Claims, 3 Drawing Sheets

INTERPOSER BOARD SIDE WALL HAVING ELECTRICAL FEATURES

TECHNICAL FIELD

The present subject matter relates to interposer boards.

BACKGROUND

Interposer boards are compression-mounted interconnect devices that are positioned between boards or sockets to allow an electrical signal to pass through.

BRIEF DESCRIPTION OF THE DRAWINGS

The drawing figures depict one or more implementations, by way of example only, not by way of limitations. In the figures, like reference numerals refer to the same or similar elements.

DETAILED DESCRIPTION

A stacked printed circuit board assembly (PCBA) including an interposer board extending between two circuit boards. The interposer board has a side wall including test pads that are electrically tied to vias extending between electronic components of one circuit board and electronic components of another circuit board to allow testing of the electronic components. The test pads increase the number of probing points of the PCBA. Electrical traces electrically interconnect the test pads to the electronic components and may include electrical traces extending laterally through the interposer boards.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

Reference now is made in detail to the examples illustrated in the accompanying drawings and discussed below.

Stacking PCBAs has become a common practice in the electronics industry. This technique is used to save real estate on the form factor design, which allows for miniaturization and/or addition of more features into the design. However, there is a challenge inherent with this design, including testing coverage after the boards are soldered together. The boards can be tested separately, but the test coverage of the PCBAs after the integration is very limited because there are a limited number of test points that can be added at the top board surface, that can be connected to circuitries including vias inside the stack.

Figure 1:
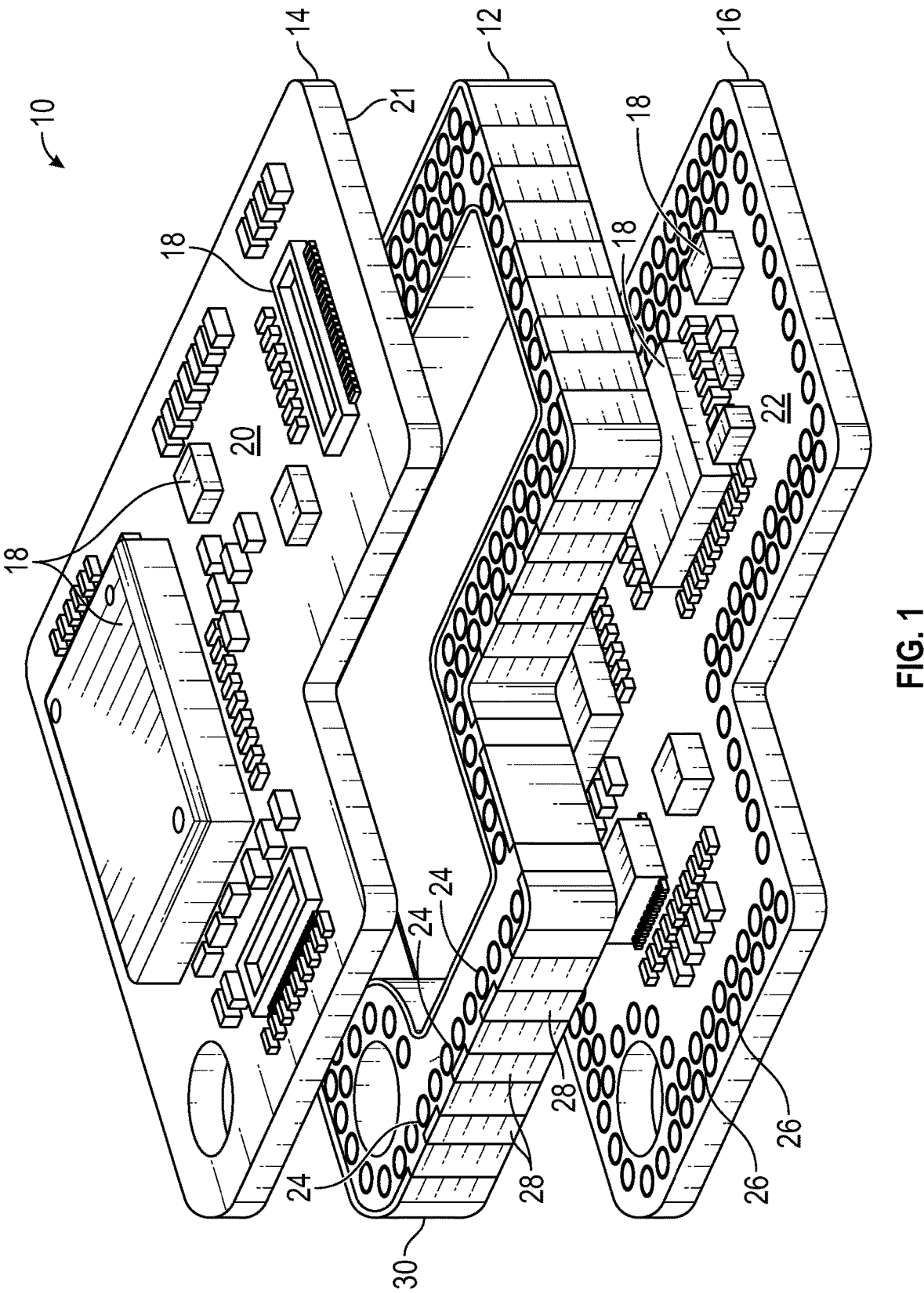
FIG. 1 is an exploded perspective view of a stacked printed circuit board assembly (PCBA) including an interposer board between two printed circuit boards.

FIG. 1 is an exploded perspective view of a PCBA 10 having an interposer board 12 positioned between a top circuit board 14 and a bottom circuit board 16. The top circuit board 14 and the bottom circuit board 16 each have respective electronic components 18 interconnected by electrical traces, such as copper, formed on an upper surface 20 and an upper surface 22, respectively. Example electronic components 18 include, by way of non-limiting example, processors, memory, and connectors. The respective electronic components 18 of each board are electrically interconnected to each other by vias 24 of the interposer board 12 extending from a bottom surface 21 of the top circuit board 14 to upper surface 22 of bottom circuit board 16. The vias 24 each electrically and physically mate with respective corresponding electrical contacts 26 of the opposing circuit boards 14 and 16, such as by soldering, where the contacts 26 are electrically connected to the respective electronic components 18. The interposer vias 24 can carry analog signals such RF or sensing signals, digital signals at high and low speed range and power rails.

Figure 2:
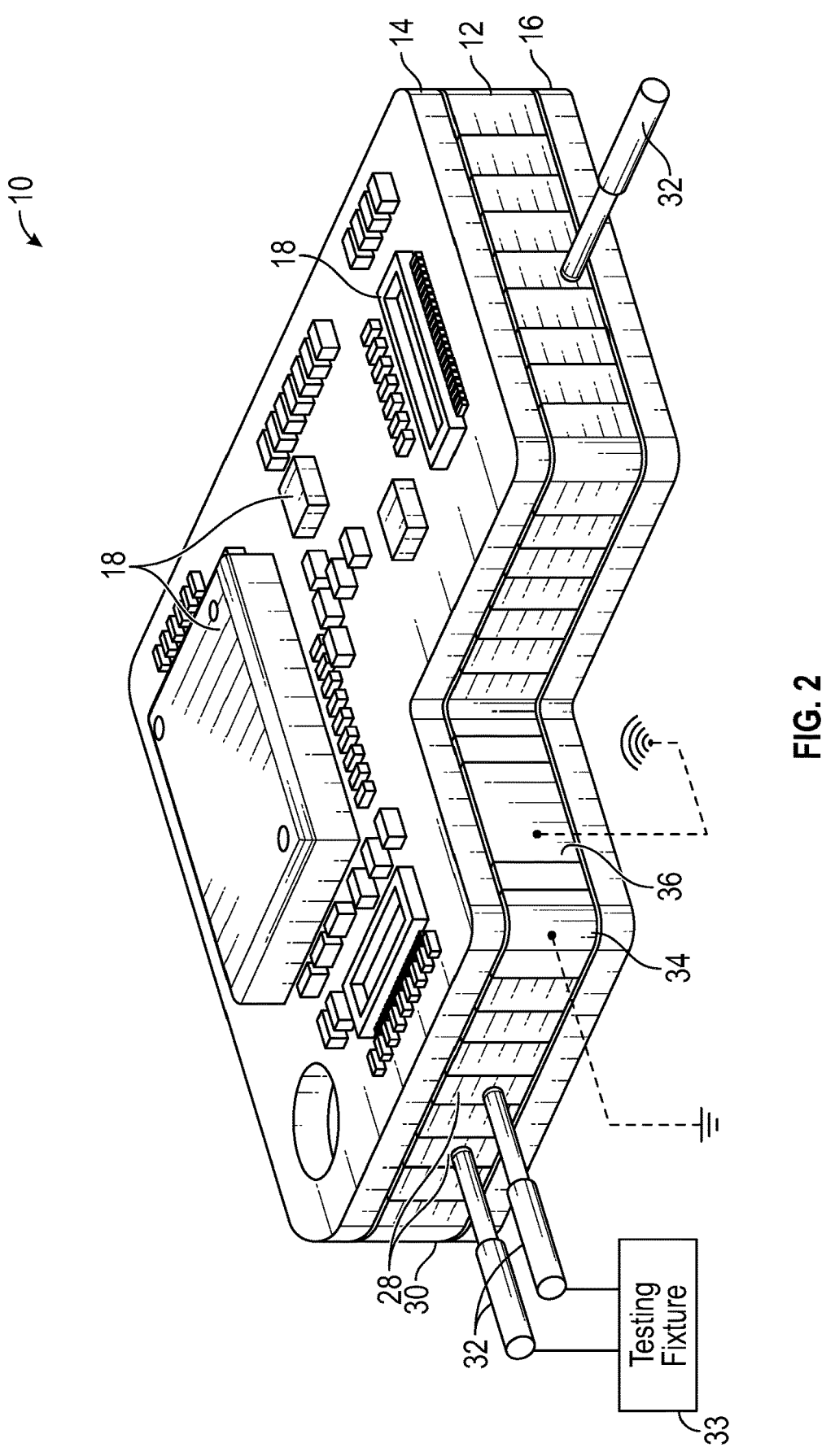
FIG. 2 is a perspective view of the assembled PCBA of FIG. 1.

The interposer board 12 has electrical test pads 28 on a side wall 30 that in the illustrated example extend between the top circuit board 14 and the bottom circuit board 16. The test pads 28 each have a relatively large surface area for easy probe access, and in an example, are rectangular prisms. The test pads 28 increase the number of probing points to the vias 24 and increase test coverage. Testing probes 32 of a circuit testing fixture 33 can electrically contact the test pads 28 horizontally (e.g., parallel to the circuit board surface 20), as illustrated in FIG. 2. In an example, probes 32 engage test pads 28 horizontally instead of vertically. In another example, PCBA 10 is placed vertically into testing fixture 33 where probes 32 engage the test pads 28 from the top and bottom. In addition to test pads 28, other features may be provided on the interposer side wall 30. For example, electrical contacts for system integration include a ground 34, and an antenna 36 for a wireless transceiver of electronic components 18. Signals from the test pads 28 on the interposer side wall 30 can be connected to a system by spring contacts. Antenna 36, such as a loop antenna, has proper electrical characterization formed on the interposer side wall 30.

Figure 3:
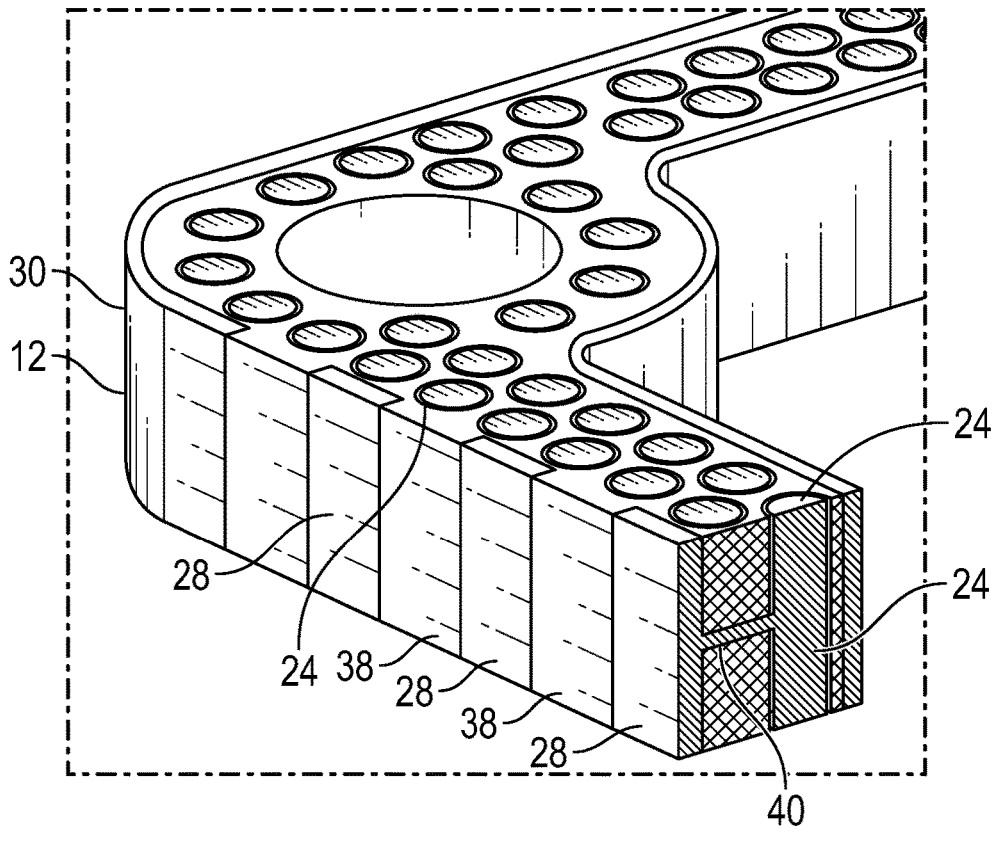
FIG. 3 is a partial sectional view of the interposer board illustrating the electrical side contacts in electrical communication with vias extending between a top surface of the interposer board and a bottom surface of the interposer board.

As shown in the cross-sectional view of interposer board 12 in FIG. 3, test pads 28 are separated from each other by electrically nonconductive interruptions 38 on interposer side wall 30 positioned between the test pads 28. Test pads 28 are interconnected to respective vias 24, for example, by electrical traces on top surface 20 of top circuit board 14 and upper surface 22 of bottom circuit board 16. In another example, test pads 28 are connected to respective vias 24 by a respective electrical trace 40 laterally extending in interposer board 12.

Although a PCBA with two circuit boards is illustrated and described, another example of a PCBA may include more than two circuit boards with an interposer board such as described herein disposed between one or more adjacent boards. In an example, three or more circuit boards may be provided with an interposer board disposed between each of the circuit boards.

Figure 4:
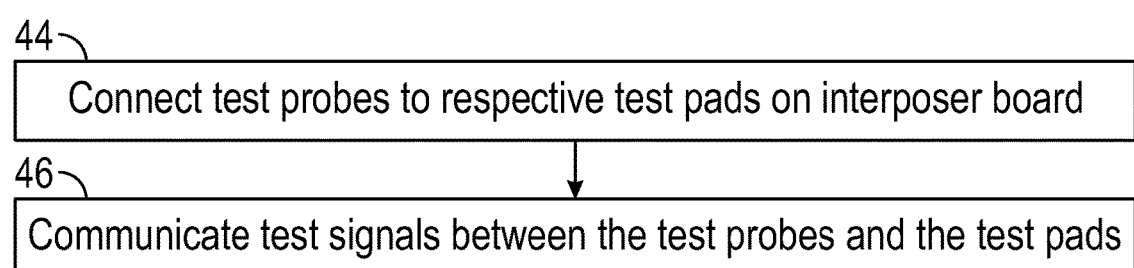
FIG. 4 is a flow diagram of a method of testing electronic components of the PCBA.

FIG. 4 is a flowchart 42 illustrating example steps of testing electronic components 18 using test pads 28 of interposer board 12.

At step 44, test probes 32 of testing fixture 33 are physically and electrically coupled to respective test pads 28 of PCBA 10. Test probes 32 are also connected to ground 34, and portions of electronic components 18.

At step 46, test signals are communicated between test probes 32 and test pads 28 associated with electronic components 18. The test signals are applied to electronic components 18 to determine performance, and possible defects of the electronic components 18 as well as PCBA 10, such a defective vias 24 or electrical traces on the top circuit board 14 and the bottom circuit board 16. The reading of the signals could be voltage levels, frequency, or digital state of a point on circuitry. The pass/fail criteria can be determined by a reference known values and their boundaries when applicable.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as #10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A printed circuit board assembly (PCBA), comprising:
a first circuit board having first electronic components;
a second circuit board having second electronic components; and
an interposer board disposed between the first and second circuit boards and having a plurality of vias, each via extending within the interposer board and electrically coupling one of the first electronic components with a corresponding one of the second electronic components, wherein the interposer board has a side wall extending between the circuit boards and having a plurality of test pads, each of the test pads electrically coupled to a corresponding one of the plurality of vias.

2. The PCBA of claim 1, wherein the plurality of test pads are separated from one another by an interrupt comprising an electrically nonconductive material.

3. The PCBA of claim 1, wherein the plurality of test pads extend between the circuit boards.

4. The PCBA of claim 3, wherein the plurality of test pads are rectangular prisms.

5. The PCBA of claim 1, further comprising:
electrically conductive traces extending between the plurality of test pads and one of the plurality of vias.

6. The PCBA of claim 5, wherein the electrically conductive traces extend through the interposer board.

7. The PCBA of claim 6, wherein the plurality of vias extend vertically through the interposer board and the electrically conductive traces extend laterally through the interposer board.

8. The PCBA of claim 1, wherein one of the plurality of test pads is configured to couple to ground.

9. The PCBA of claim 1, further comprising:
an antenna formed on the side wall.

10. A method of testing a printed circuit board assembly (PCBA) having a first circuit board having first electronic components, a second circuit board having second electronic components, and an interposer board disposed between the first circuit board and the second circuit board and having a plurality of vias, each via extending within the interposer board and electrically coupling one of the first electronic components with a corresponding one of the second electronic components, wherein the interposer board has a side wall extending between the circuit boards and having a plurality of test pads each electrically coupled to a corresponding one of the plurality of vias, the method comprising:
coupling a test probe to at least one of the test pads; and
applying a test signal via the test probe to the at least one of the test pads and testing the electronic components.

11. The method of claim 10, wherein the plurality of test pads are separated from one another by an interrupt comprising an electrically nonconductive material.

12. The method of claim 10, wherein the plurality of test pads extend between the first and second circuit boards.

13. The method of claim 12, wherein the plurality of test pads are rectangular prisms.

14. The method of claim 10, wherein the PCBA further comprises & #electrically conductive traces extending between at least-one of the plurality of test pads and the plurality of vias.

15. The method of claim 14, wherein the electrically conductive traces extend through the interposer board.

16. The method of claim 15, wherein the plurality of vias extend vertically through the interposer board and the electrically conductive traces extend laterally through the interposer board.

17. The method of claim 10, wherein one of the test pads is coupled to ground.

18. The method of claim 10, wherein the PCBA further comprises an antenna formed on the side wall.

19. A system, comprising:

a printed circuit board assembly (PCBA), comprising:

a first circuit board having first electronic components;

a second circuit board having second electronic components; and an interposer board disposed between the first and second circuit boards and having a plurality of vias, each via extending within the interposer board and electrically coupling one of the first electronic components with a corresponding one of the second electronic components, wherein the interposer board has a side wall extending between the circuit boards and having a plurality of test pads each electrically coupled to one of the vias; and a testing fixture having a test probe coupled to at least one of the test pads and configured to apply a test signal via the test probe to the at least one of the test pads and test the electronic components.

20. The system of claim 19, further comprising electrically conductive traces extending between the plurality of test pads and one of the plurality of vias.

\* \* \* \* \*